(12) United States Patent
Prajuckamol et al.

(10) Patent No.: US 10,971,428 B2
(45) Date of Patent: Apr. 6, 2021

(54) SEMICONDUCTOR BASEPLATES

(71) Applicant: SEMICONDUCTOR COMPONENTS INDUSTRIES, LLC, Phoenix, AZ (US)

(72) Inventors: Atapol Prajuckamol, Thanyaburi (TH); Francis J. Carney, Mesa, AZ (US); Chee Hiong Chew, Seremban (MY); Yushuang Yao, Shenzhen (CN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/447,195

(22) Filed: Jun. 20, 2019

(65) Prior Publication Data

US 2020/0402887 A1    Dec. 24, 2020

(51) Int. Cl.
*H01L 23/40* (2006.01)
*H01L 23/13* (2006.01)

(52) U.S. Cl.
CPC .......... *H01L 23/4006* (2013.01); *H01L 23/13* (2013.01); *H01L 2023/4087* (2013.01)

(58) Field of Classification Search
CPC .............. H01L 23/4006; H01L 23/13; H01L 2023/4087
See application file for complete search history.

(56) References Cited

U.S. PATENT DOCUMENTS

| | | | |
|---|---|---|---|
| 8,164,909 B2 | 4/2012 | Nagase et al. | |
| 2005/0280998 A1* | 12/2005 | Lin | H05K 7/209 361/704 |
| 2008/0079145 A1* | 4/2008 | Tschirbs | H01L 23/3735 257/706 |
| 2009/0108403 A1* | 4/2009 | Gogoi | H01L 28/91 257/532 |
| 2011/0268152 A1* | 11/2011 | Becker | H05K 1/0206 374/179 |
| 2017/0236767 A1* | 8/2017 | Miyakawa | B22D 19/04 428/602 |

* cited by examiner

*Primary Examiner* — Sitaramarao S Yechuri
(74) *Attorney, Agent, or Firm* — Adam R. Stephenson, Ltd.

(57) ABSTRACT

A semiconductor baseplate is disclosed. Specific implementations of a baseplate may include a planar portion including a plurality of recesses therein, the planar portion may be made of a first material, and a plurality of pegs where each peg of the plurality of pegs may be configured to fit within each recess of the plurality of recesses, the plurality of pegs may be made of a second material, where the first material and the second material may be bonded together.

18 Claims, 3 Drawing Sheets

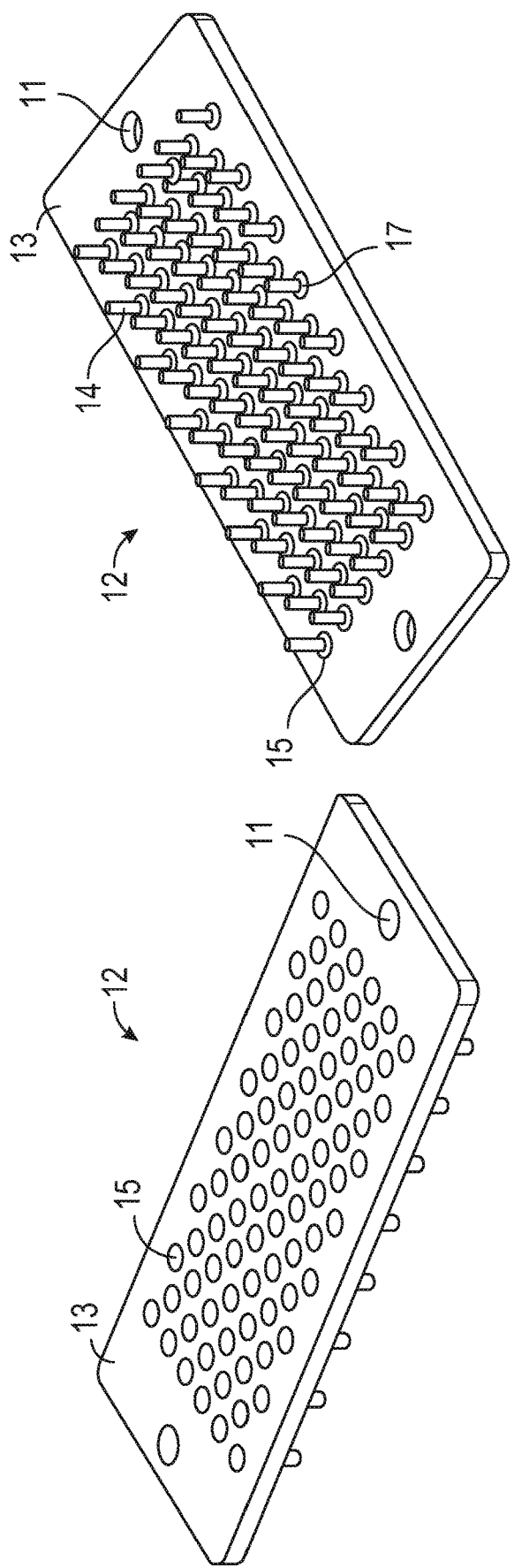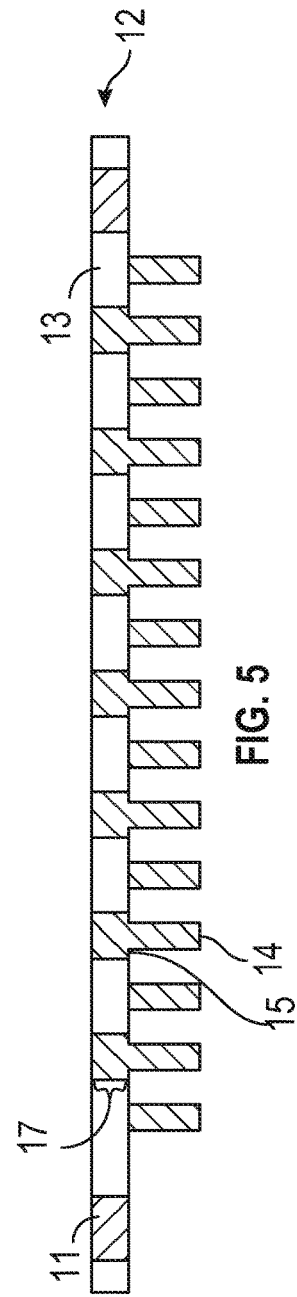
FIG. 3
FIG. 4
FIG. 5

SEMICONDUCTOR BASEPLATES

BACKGROUND

1. Technical Field

Aspects of this document relate generally to semiconductor packages. More specific implementation relate to semiconductor baseplates.

2. Background

Semiconductor packages may contain a wide variety of semiconductor devices. In some semiconductor package types, power semiconductor devices capable of handling many hundreds of volts may be included. In various semiconductor package types, the semiconductor devices are bonded to a substrate that provides electrical connection to the various devices.

SUMMARY

Implementations of baseplates may include: a planar portion including a plurality of recesses therein, the planar portion being made of a first material, and a plurality of pegs where each peg of the plurality of pegs may be configured to fit within each recess of the plurality of recesses. The plurality of pegs may be made of a second material, where the first material and the second material may be bonded together.

Implementations of baseplates may also include one, all, or any of the following:

Each recess of the plurality of recesses in the planar portion may be a recess therethrough.

Each recess of the plurality of recesses may form a closed shape.

Each recess of the plurality of recesses may form a hexagonal shape.

Each recess of the plurality of recesses may form a circular shape.

Each of the plurality of pegs may include a plug.

Each of the plurality of pegs may include a pin.

The planar portion may include at least one screw hole therethrough.

The first material may be made of a metal with a coefficient of linear thermal expansion close to a substrate material to which the planar portion may be configured to be coupled to.

The second material may be made of a material that may be more thermally conductive than the first material.

Each peg of the plurality of pegs may be configured to directly contact a bonding material, and the bonding material may be configured to couple to a substrate.

Implementations of baseplates may include: a planar portion including a plurality of recesses therethrough, the planar portion may be made of a first material, and a plurality of pegs where each peg of the plurality of pegs may be configured to fit within each recess of the plurality of recesses. The plurality of pegs may be made of a second material, where the first material and the second material may be bonded together.

Implementations of baseplates may also include one, all, or any of the following:

Each recess of the plurality of recesses may form a closed shape.

The planar portion may include at least one screw hole therethrough.

The first material may be made of a metal with a coefficient of linear thermal expansion close to a substrate material to which the planar portion may be configured to be coupled to.

The second material may be made of a material that may be more thermally conductive than the first material.

Each peg of the plurality of pegs may be configured to directly contact a bonding material, and the bonding material may be configured to couple to a substrate.

Implementations of baseplates may include: a planar portion including a plurality of recesses therein, the planar portion may be made of a first material, and a plurality of pegs where each peg of the plurality of pegs may be configured to fit within each recess of the plurality of recesses. The plurality of pegs may be made of a second material.

Implementations of baseplates may also include one, all, or any of the following:

The first material and the second material may be bonded together.

The first material may be made of a metal with a coefficient of linear thermal expansion close to a substrate material to which the planar portion may be configured to be coupled to, and the second material may be made of a material that is more thermally conductive than the first material.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 3 illustrates the implementation of the baseplate, as shown in FIG. 1, with pegs of an alternate shape;

FIG. 4 illustrates a view of an opposing side of the implementation of the baseplate as shown in FIG. 3;

FIG. 5 illustrates a cross sectional view of the implementation of the baseplate as shown in FIGS. 3 and 4 taken through a line passing through both of the screw holes in the baseplate.

DESCRIPTION

This disclosure, its aspects and implementations, are not limited to the specific components, assembly procedures or method elements disclosed herein. Many additional components, assembly procedures and/or method elements known in the art consistent with the intended semiconductor baseplates will become apparent for use with particular implementations from this disclosure. Accordingly, for example, although particular implementations of baseplates are disclosed, such implementations and implementing components may comprise any shape, size, style, type, model, version, measurement, concentration, material, quantity, method element, step, and/or the like as is known in the art for such semiconductor baseplates, and implementing components and methods, consistent with the intended operation and methods.

Electronic devices as semiconductor components may generate an excess amount of heat during operation which requires management and optimization of the transfer of thermal energy away from the components. Generally, semiconductor packages may include a heat sink which transfers the heat generated by the package away from the device. In such implementations, the heat sink may be configured to transfer the thermal energy to cooling fluid (air or other liquid) or via other cooling mechanism. Increasing the efficiency of this heat transfer protects the semiconductor device from failure or damage. In some implementations, a heat sink is coupled to an electronic component of a semiconductor package through a baseplate. The baseplate may be designed to improve the transfer of heat from the electronic components to the heat sink or at a minimum, not inhibit the transfer of heat from the electronic components to the heatsink. In order to facilitate the transfer of heat away from the semiconductor component, a baseplate made of two or more materials may be used as in the implementations of baseplates disclosed here.

Figure 1:
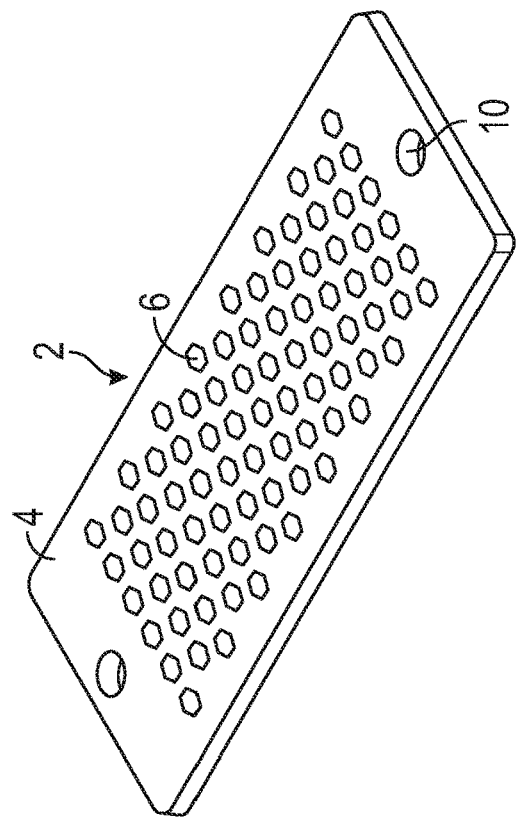
FIG. 1 illustrates an implementation of a baseplate.

Referring to FIG. 1, an implementation of a baseplate 2 is illustrated. As illustrated, the baseplate 2 includes a planar portion 4. In various implementations, the planar portion 4 may be of a substantially rectangular shape, creating a plate structure, as illustrated. In other various implementations, the planar portion 4 may form a square, circle, or any other closed shape. In yet other various implementations, the planar portion 4 may be a single, solid piece, or it may be constructed from multiple pieces soldered, or otherwise coupled, together. Also, in various implementations, the baseplate may be formed of two or more layers of material.

Figure 2:
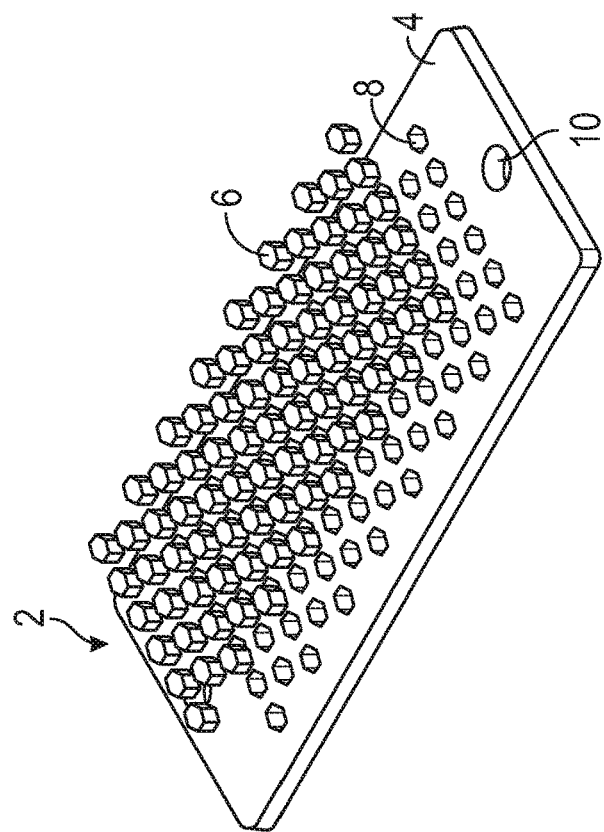
FIG. 2 illustrates an exploded view of the implementation of the baseplate as shown in FIG. 1.

As illustrated and referring to FIG. 2, a plurality of pegs 6 fit within recesses 8 formed in the planar portion 4. In a various implementations, the recesses 8 pass all the way through the planar portion 4, extending from one side through to the opposing side (extending therethrough). In such implementations, the pegs 6 rest within the recesses 8, retained by a tight tolerance between the material of the pegs 6 and the edges of the recesses 8. In various implementations, the pegs 6 are sized so that they are substantially the same length as the thickness of the baseplate 2 and sit substantially flush with the largest planar surfaces of the baseplate 2 when inserted into the recesses 8. Where the pegs 6 extend all the way through the baseplate 2 via the recesses 8, this allows the pegs 6 to come in direct contact with any material or component that is affixed to, or placed against, either side of the planar portion 4 of the baseplate. In particular implementations, the planar portion 4 is made of a first material and the pegs 6 are made of a second material, which are then coupled together when the pegs 6 are fitted into the recesses 8. In some implementations, the pegs 6 may be bonded into the recesses 8 through the use of an adhesive or glue.

In various implementations, the first material may be made of a metal which has a coefficient of linear thermal expansion which close to that of a substrate material to which the planar portion 4 is configured to be coupled to. The second material is then made of a material that is more thermally conductive (has a higher conductive heat transfer coefficient than the conductive heat transfer coefficient of the first material). In this way, the higher thermal conductivity of the second material allows for increasing the transfer of heat from a semiconductor component to a heat sink via the same surface area of the baseplate 2, while the first material acts to ensure the baseplate 2 expands and contracts at approximately the same rate(s) as the substrate/material to which the baseplate 2 is coupled. In various implementations, the planar portion 4 of the baseplate 2 may be made of such a first material that provides mechanical strength and better thermal expansion, such as, by non-limiting example, copper or aluminum silicon carbide. In various implementations the second material that makes up the pegs 6 may be made of a material that provides better thermal transfer, such as, by non-limiting example, graphene, copper, or graphite. In other various implementations, the planar portion 4 and the pegs 6 made be made of similar, or the same, material.

As illustrated in FIG. 1, the baseplate 2 and the plurality of pegs 6, when fit together, form a substantially smooth surface on either side of the planar portion 4. In various implementations, each peg 6 may form a plug, that when inserted into the recess rests substantially flush with a largest planar surface of the planar portion 4 of the baseplate 2. In such implementations, the differing materials of the pegs 6 and the planar portion 4 may be selected so that their coefficients of linear thermal expansion are similar so as to allow both materials, and thus the baseplate 2 as a whole, to expand and contract under heating and cooling at the same rate. In such implementations, the rate of thermal conductivity may be increased as the peg 6 passes completely through the planar portion 4 of the baseplate 2 is able to directly contact a heat sink. In this way, each of the pegs 6 acts as a local heat pipe to the heat sink. In such implementations, each peg 6 is configured to directly contact a bonding material which is used to couple the baseplate 2 to the substrate or other surface the baseplate 2 is coupled to.

As illustrated in FIG. 1, the planar portion 4 of the baseplate 2 also includes at least one screw hole 10. In various implementations, the screw hole 10 may be of differing size and shape than the recesses within the planar portion 4, or it may be of the same size and shape. As illustrated, the screw holes 10 may be disposed through the planar portion 4 on opposing edges of the planar portion 4. In other implementations, the screw holes 10 may be disposed through the planar portion 4 on any side in any face of the baseplate 2. In various implementations, by non-limiting example, there may be two or more screw holes 10 disposed through the planar portion 4. In other various implementations, the baseplate 2 may include at least one hole formed therethrough that allows for the attachment of the baseplate 2 to a heat sink or other semiconductor package component by means of, by non-limiting example, screws, pins, rods, or any other means of attachment.

Referring to FIG. 2, an exploded view of the implementation of the baseplate 2 as shown in FIG. 1 is illustrated. As illustrated, the baseplate 2 includes the planar portion 4. As illustrated, the baseplate 2 includes a plurality of recesses 8 formed therein. In various implementations, each of the recesses 8 may form a hole all the way through the baseplate 2, forming a complete void from one face of the planar portion 4 of the baseplate 2 to the opposing face of the planar portion 4. In other implementations, however, the recesses 8 may include a shoulder at one end, which narrows the width of the recess at one end. As illustrated, one or more pegs 6 may fit within the recesses 8. Where the recesses 8 contain a shoulder, the one or more pegs 6 may include a corresponding flange that engages with the shoulder and allows a narrowed portion of the peg 6 to extend past the shoulder into the thickness of the baseplate. In other implementations, the one or more pegs 6 may not include a flange, and may be shorter than a thickness of the baseplate 2 so that the pegs 6 can rest against the shoulder (and be retained in the recesses 8). In such implementations, the pegs 6 may fit snugly within the recesses 8 and may only rest substantially flush with a largest planar surface of the planar portion 4 of the baseplate 2 on one side. In other implementations where a shoulder is used in the recesses 8, the length of the pegs 6 may be selected so that the pegs 6 extend beyond the largest planar surface/portion 4 of the baseplate 2.

As illustrated, the recesses 8 may be of a hexagonal shape. In other various implementations, the perimeter of the recesses 8 may be a wide variety of shapes, such as, by non-limiting example, a circular shape, square shape, rectangular shape, ellipsoidal shape, a polygonal shape, or any other closed shape.

Referring to FIGS. 3 and 4, a baseplate 12 implementation is illustrated with pegs and recesses of an alternate shape. As illustrated, the baseplate 12 includes planar portion 13. As illustrated, a plurality of pegs 15 are each coupled into recesses 17 in the planar portion 13, as previously described. As illustrated, the pegs 15 include pins that fit within the planar portion 13. In various implementations, each of the plurality of pegs 15 may extend outward from the planar portion 13 of the baseplate 12. In such implementations, a first side of the peg 15 may be substantially flush with a largest planar surface of the planar portion 13, and a second side of the peg 15 may protrude outward from an opposing planar surface of the planar portion 13, and the peg 15 may be configured to directly contact, or couple with/into, another semiconductor package component. In various implementations, by non-limiting example, the cross-sectional shape of the pins that may form the pegs 15 may be of, by non-limiting example, a circle, an ellipse, a rectangle, a square, a polygon, or any other closed shape. While in this document, the pegs 15 have had a cross-sectional shape that corresponds substantially with the shape of the recesses 17, in some implementations, the pegs 15 may not correspond only to the extent to allow the pegs 15 to be inserted into/coupled with the recesses 17. By non-limiting example, the peg 15 may have a triangular cross-section while the recess 17 may be a six-sided star shape, allowing the peg 15 to be inserted into the recess 17, but leaving part of the recess 17 open. As illustrated, the planar portion 13 may also include at least one screw hole 11 that passes from one side of the planar portion 4 to the opposing side.

Referring to FIG. 4, a view of an opposing side of the implementation of the baseplate 12 as illustrated in FIG. 3 is illustrated. As illustrated, the planar portion 13 includes a plurality of recesses 17 which pass from one side of a largest planar surface of the planar portion 13 (as shown in FIG. 3) to the opposing side of the largest planar surface of the planar portion 13, as shown in FIG. 4. As illustrated in FIG. 4, the pegs 15 fit within the recesses 17. However, as illustrated in FIG. 4, the pegs 15 may include a pin portion 14 that is coupled to an end of the peg 15, which extends outward from the body of the peg 15 and the planar portion 13. In some implementations, the pin portion 14 may be formed integrally with the peg 15 itself. In others, the pin portion 14 may be coupled with the peg 15 in a variety of ways, such as, by non-limiting example, screwing into an opening in the peg 15, sliding into an opening in the peg 15, glued to an end of the peg 15, or any other method of fixedly/removably coupling the pin portion 14 with the peg 15. While in the implementation illustrated in FIG. 4 the pin portions 14 have a cross-sectional area smaller than the cross-sectional area of the pegs 15, in other implementations, the pin portions 14 may have larger cross-sectional areas than the cross-sectional areas of the pegs 15. Also, while the pin portions 14 have been illustrated as being substantially of the same cross-sectional shape along their length, in various implementations the pin portions 14 may have varying cross-sectional shape(s) along their length.

Referring to FIG. 5, a cross sectional view of the implementation of the baseplate 12 as shown in FIGS. 3 and 4 taken along a line through the screw holes 11 in the baseplate 12 is illustrated. As illustrated, the planar portion 13 of the baseplate 12 includes at least one screw hole 11 that passes from one side, or face, of the planar portion 13 to the opposing side, or face, of the planar portion 13. As can be seen in the cross sectional view of the baseplate, the planar portion 13 includes a plurality of recesses 17 which pass completely through the planar portion 13. As illustrated, the pegs 15 fit entirely within the recesses 17. As illustrated, the pegs 15 may be substantially flush with a side of the planar portion 13, on at least one side of the planar portion 13 and have a height greater than the depth of the recesses 17, so that the pegs 15 are not substantially flush with another side of the planar portion 13 (via pin portions 14). The difference in cross sectional thickness of the pin portions 14 compared to the cross section of the pegs 15 can be seen in FIG. 5.

Figure 6:
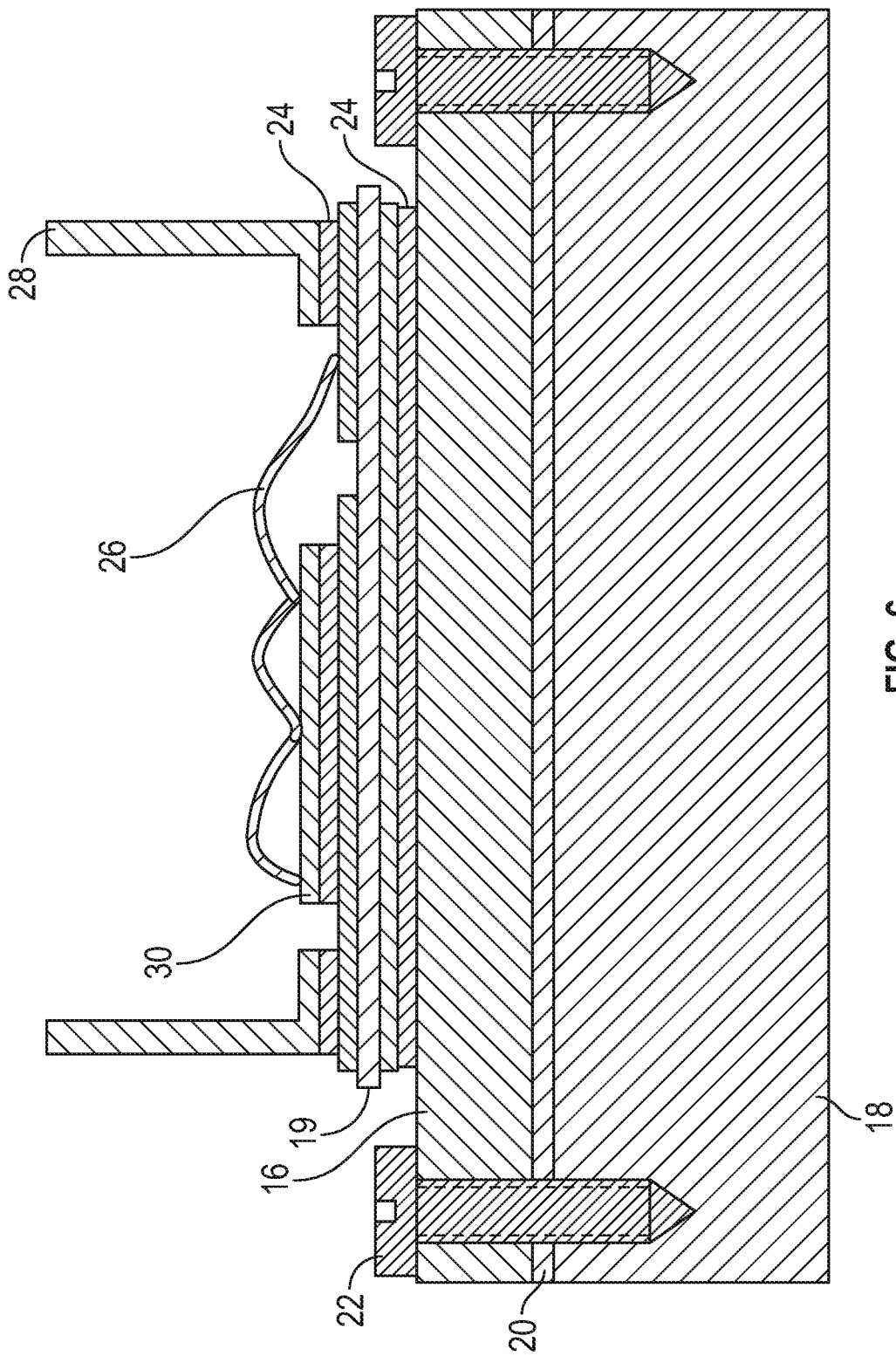
FIG. 6 illustrates the implementation of the baseplate coupled to a heat sink.

Referring to FIG. 6, the implementation of a baseplate 16 coupled to a heat sink 18 is illustrated. As illustrated, a thermal paste 20 is disposed between the baseplate 16 and the heat sink 18, so as facilitate close contact of the baseplate 16 with the heatsink 18 and aid in heat transfer between the two structures. As illustrated, the baseplate 16 and the heat sink 18 may be coupled together, or secured, with one or more screws 22. As illustrated, a semiconductor die 30 may be coupled to substrate 19 by solder 24 and the substrate 19 is coupled to baseplate 16 by solder 24 as well. In such implementations, the differing materials of the pegs and the planar portion that both make up the baseplate 16 may allow for the coefficients of linear thermal expansion to be similar, or the same, so as to allow the substrate 19 and the baseplate 16 as a whole, to thermally expand and contract at similar rates. As disclosed above, the pegs within the baseplate 16 (not shown) will facilitate conductive heat transfer to the thermal paste 20 and on to the heat sink 18. In such implementations, the rate of thermal conductivity is increased where the peg passes completely through the planar portion of the baseplate 16 and directly contacts the heat sink 18. As illustrated, a terminal 28 and a bonding wire 26 may also be coupled to the system to allow the die 30 to electrically connect with a motherboard or circuit board.

In various implementations, by non-limiting example, the substrates used in the semiconductor packages disclosed herein may be any of wide variety of substrate types, including by non-limiting example a direct bond copper (DBC) substrate, an active metal brazed (AMB) substrate, an aluminum nitride (AlN) substrate), a laminated substrate, a glass reinforced epoxy laminate substrate, and any other substrate type capable of having die and other components coupled thereto.

In places where the description above refers to particular implementations of semiconductor baseplates and implementing components, sub-components, methods and sub-methods, it should be readily apparent that a number of modifications may be made without departing from the spirit thereof and that these implementations, implementing components, sub-components, methods and sub-methods may be applied to other semiconductor baseplates.

What is claimed is:
1. A baseplate comprising:
  a planar portion comprising a plurality of recesses therein, the planar portion further comprising a first material; and a plurality of pegs wherein each peg of the plurality of pegs is configured to fit within each recess of the plurality of recesses, the plurality of pegs further comprising a second material;

wherein the first material and the second material are bonded together; and wherein each peg of the plurality of pegs is configured to directly contact a bonding material, the bonding material configured to couple to a substrate.

2. The baseplate of claim 1, wherein each recess of the plurality of recesses in its the planar portion is a recess therethrough.

3. The baseplate of claim 1, wherein each recess of the plurality of recesses forms a closed shape.

4. The baseplate of claim 3, wherein each recess of the plurality of recesses forms a hexagonal shape.

5. The baseplate of claim 3, wherein each recess of the plurality of recesses forms a circular shape.

6. The baseplate of claim 1, wherein each of the plurality of pegs comprise a plug.

7. The baseplate of claim 1, wherein each of the plurality of pegs comprise a pin.

8. The baseplate of claim 1, wherein the planar portion further comprises at least one screw hole therethrough.

9. The baseplate of claim 1, wherein the first material comprises a metal with a coefficient of linear thermal expansion close to a substrate material to which the planar portion is configured to be coupled to.

10. The baseplate of claim 1, wherein the second material comprises a material that is more thermally conductive than the first material.

11. A baseplate comprising:

a planar portion comprising a plurality of recesses therethrough, the planar portion further comprising a first material; and a plurality of pegs wherein each peg of the plurality of pegs is configured to fit within each recess of the plurality of recesses, the plurality of pegs further comprising a second material;

wherein the first material and the second material are bonded together; and wherein each peg of the plurality of pegs is configured to directly contact a bonding material, the bonding material configured to couple to a substrate.

12. The baseplate of claim 11, wherein each recess of the plurality of recesses forms a closed shape.

13. The baseplate of claim 11, wherein the planar portion further comprises at least one screw hole therethrough.

14. The baseplate of claim 11, wherein the first material comprises a metal with a coefficient of linear thermal expansion close to a substrate material to which the planar portion is configured to be coupled to.

15. The baseplate of claim 11, wherein the second material comprises a material that is more thermally conductive than the first material.

16. A baseplate comprising:

a planar portion comprising a plurality of recesses therein, the planar portion further comprising a first material; and a plurality of pegs wherein each peg of the plurality of pegs is configured to fit within each recess of the plurality of recesses, the plurality of pegs further comprising a second material;

wherein each peg of the plurality of pegs is configured to directly contact a bonding material, the bonding material configured to couple to a substrate.

17. The baseplate of claim 16, wherein the first material and the second material are bonded together.

18. The baseplate of claim 16, wherein the first material comprises a metal with a coefficient of linear thermal expansion close to a substrate material to which the planar portion is configured to be coupled to, and the second material comprises a material that is more thermally conductive than the first material.

* * * * *